US012765372B2

(12) United States Patent
Chen et al.

(10) Patent No.: US 12,765,372 B2
(45) Date of Patent: Oct. 13, 2026

(54) METHOD FOR MANUFACTURING EMBEDDED AND PACKAGED HEAT DISSIPATION STRUCTURE

(71) Applicant: Zhuhai ACCESS Semiconductor Co., LTD., Zhuhai (CN)

(72) Inventors: Xianming Chen, Zhuhai (CN); Xiaowei Xu, Zhuhai (CN); Wenjian Lin, Zhuhai (CN); Benxia Huang, Zhuhai (CN); Gao Huang, Zhuhai (CN)

(73) Assignee: ZHUHAI ACCESS SEMICONDUCTOR CO., LTD., Doumen (CN)

( * ) Notice: Subject to any disclaimer, the term of this patent is extended or adjusted under 35 U.S.C. 154(b) by 369 days.

(21) Appl. No.: 18/390,241

(22) Filed: Dec. 20, 2023

(65) Prior Publication Data

US 2024/0222143 A1 Jul. 4, 2024

(30) Foreign Application Priority Data

Dec. 30, 2022 (CN) ........................ 202211722261.5

(51) Int. Cl.
*H10W 40/40* (2026.01)
*H10W 40/00* (2026.01)
(Continued)

(52) U.S. Cl.
CPC ....... *H10W 40/037* (2026.01); *H10W 40/228* (2026.01); *H10W 40/258* (2026.01); *H10W 40/40* (2026.01); *H10W 70/02* (2026.01)

(58) Field of Classification Search
CPC ............. H10W 40/037; H10W 40/226; H10W 40/228; H10W 40/258; H10W 40/40
See application file for complete search history.

(56) References Cited

U.S. PATENT DOCUMENTS

2012/0043127 A1 2/2012 Lin et al.
2019/0385925 A1* 12/2019 Walczyk ............ H10W 40/037
(Continued)

FOREIGN PATENT DOCUMENTS

CN 113675158 A 11/2021
CN 115116997 A 9/2022
(Continued)

OTHER PUBLICATIONS

Japan Patent Office. First Office Action for JP Application No. 2023-222995, mailed Jan. 21, 2025, pp. 1-16.
(Continued)

*Primary Examiner* — Yara B Green
*Assistant Examiner* — Christopher M Roland
(74) *Attorney, Agent, or Firm* — The Dobrusin Law Firm, P.C.; Daniela M. Thompson-Walters

(57) ABSTRACT

A method for manufacturing an embedded and packaged heat dissipation structure includes: forming a semi-finished plate, the semi-finished plate including an embedded device and a first metal layer attached to a non-pin surface of the embedded device; forming a heat dissipation plate attached to the non-pin surface of the embedded device; manufacturing a heat dissipation copper column; providing a dielectric layer covering the heat dissipation copper column; laminating a second metal layer; partially etching the second metal layer and the dielectric layer to form a microchannel in which the heat dissipation copper column and the heat dissipation plate are arranged; removing a remaining part of the second metal layer; and laminating a sealing layer on the dielectric layer to seal the microchannel in a direction perpendicular to a semi-finished plate to obtain the embedded and packaged heat dissipation structure.

5 Claims, 3 Drawing Sheets

(51) Int. Cl.
*H10W 40/22* (2026.01)
*H10W 40/25* (2026.01)
*H10W 70/02* (2026.01)

(56) References Cited

U.S. PATENT DOCUMENTS

| | | | | |
|---|---|---|---|---|
| 2020/0273777 | A1 | 8/2020 | Jain et al. | |
| 2021/0020538 | A1* | 1/2021 | Chen | H10P 14/412 |
| 2023/0010115 | A1* | 1/2023 | Chen | H10W 40/40 |
| 2024/0006270 | A1* | 1/2024 | Kuo | H10W 40/22 |
| 2024/0063079 | A1* | 2/2024 | Shao | H10W 40/037 |
| 2024/0266244 | A1* | 8/2024 | Chen | H10W 40/226 |

FOREIGN PATENT DOCUMENTS

| | | | |
|---|---|---|---|
| JP | H0661369 | A | 7/2015 |
| JP | 2017108019 | A | 6/2017 |
| KR | 20160033844 | A | 3/2016 |
| WO | 2015112828 | A1 | 7/2015 |
| WO | 2017038713 | A1 | 3/2017 |

OTHER PUBLICATIONS

Japan Patent Office. Second Office Action for JP Application No. 2023-222995, mailed May 13, 2025, pp. 1-17.
Korean Intellectual Property Office. First Office Action for KR Application No. 10-2023-0195307, mailed May 9, 2025, pp. 1-25.

* cited by examiner

METHOD FOR MANUFACTURING EMBEDDED AND PACKAGED HEAT DISSIPATION STRUCTURE

CROSS-REFERENCE TO RELATED APPLICATION

This application is based on and claims the benefit of priority from Chinese Patent Application No. 202211722261.5, filed on Dec. 30, 2022, the entirety of which is incorporated by reference herein.

TECHNICAL FIELD

The present disclosure refers to the technical field of semiconductor manufacturing, and in particular to an embedded and packaged heat dissipation structure and a manufacturing method therefor, and a semiconductor.

BACKGROUND

In the existing technology, the traditional embedding and packaging method is to attach chips and other components to a polymer frame or a core material with a preset cavity, and then use a plastic packaging material for packaging. Like an organic matrix frame with a preset cavity disclosed in the patent publication CN105679682A, after active and passive components are attached in the preset cavity, the packaging is realized by laminating a dielectric material, such as a packaging method disclosed in the patent publication CN104332414A.

The traditional solution in which the chips and other components are attached to the polymer frame or the core material with the preset cavity, and then the plastic packaging material is used for packaging, has the following disadvantages: with the emerging of a high-frequency, high-speed and high-power product, an embedded and packaged product has extremely high heat dissipation requirements, and even the organic polymer material with good heat dissipation has a limitation to a heat dissipation characteristics, which cannot solve the heat dissipation problem of a high-frequency, high-speed and high-power embedded product. Therefore, a novel method for manufacturing an embedded and packaged heat dissipation structure is urgently needed.

SUMMARY

An objective of the present disclosure is to solve at least one of technical problems in the existing technology to a certain extent.

To achieve the above objective, teachings of the present disclosure provide an embedded and packaged heat dissipation structure and a manufacturing method therefor, and a semiconductor, and the method can improve the heat dissipation effect for an embedded device.

In an embodiment of the present disclosure, a method for manufacturing an embedded and packaged heat dissipation structure is provided, comprising: forming a semi-finished plate, wherein the semi-finished plate comprises an embedded device and a first metal layer; and the first metal layer is attached to a non-pin surface of the embedded device; forming a heat dissipation plate based on the first metal layer, wherein the heat dissipation plate is attached to the non-pin surface of the embedded device; manufacturing a heat dissipation copper column on the heat dissipation plate; providing a dielectric layer, wherein the dielectric layer covers the heat dissipation copper column; laminating a second metal layer on the dielectric layer; partially etching the second metal layer and the dielectric layer to form a microchannel, wherein the heat dissipation copper column and the heat dissipation plate are arranged in the microchannel, and both an outlet and an inlet of the microchannel are arranged on a side surface of the semi-finished plate perpendicular to a direction of the semi-finished plate; removing a remaining part of the second metal layer; and laminating a sealing layer on the dielectric layer to seal the microchannel in a direction perpendicular to the semi-finished plate to obtain the embedded and packaged heat dissipation structure.

Moreover, the method for manufacturing an embedded and packaged heat dissipation structure according to an embodiment of the present disclosure has the following additional technical features:

Further, in an embodiment of the present disclosure, the forming a heat dissipation plate based on the first metal layer comprises: applying a photoetching film to enable the photoetching film to cover the first metal layer; exposing the photoetching film to form a heat dissipation plate pattern; and etching the photoetching film and the heat dissipation plate pattern to form the heat dissipation plate.

Further, in an embodiment of the present disclosure, the second metal layer is made of titanium or aluminum.

Further, in an embodiment of the present disclosure, the partially etching the second metal layer and the dielectric layer to form a microchannel comprises: forming a window on the second metal layer through a photoetching film applying process, an exposing process and an etching process in sequence, wherein a projection of the window in the direction perpendicular to the semi-finished plate is the same as a projection of the microchannel in the direction perpendicular to the semi-finished plate; and etching the dielectric layer to expose the heat dissipation plate and the heat dissipation copper column to form the microchannel.

Further, in an embodiment of the present disclosure, the laminating a sealing layer on the dielectric layer to seal the microchannel in a direction perpendicular to the semi-finished plate to obtain the embedded and packaged heat dissipation structure comprises: applying an adhesive layer on the dielectric layer; and laminating the sealing layer on the adhesive layer to seal the microchannel in the direction perpendicular to the semi-finished plate to obtain the embedded and packaged heat dissipation structure.

In another aspect, an embodiment of the present disclosure further provides an embedded and packaged heat dissipation structure obtained by the method for manufacturing an embedded and packaged heat dissipation structure according to any one of above embodiments, comprising: the embedded device, the heat dissipation plate, the heat dissipation copper column, the microchannel and the sealing layer, wherein the heat dissipation plate and the heat dissipation copper column are arranged in the microchannel; the non-pin surface of the embedded device is attached to the heat dissipation plate; the heat dissipation copper column is connected with the heat dissipation plate; and the sealing layer is configured for sealing the microchannel in the direction perpendicular to the heat dissipation structure.

Further, in an embodiment of the present disclosure, a number of the embedded device is one or more.

Further, in an embodiment of the present disclosure, a number of the heat dissipation copper column is one or more.

Further, in an embodiment of the present disclosure, the embedded and packaged heat dissipation structure further comprises a circuit layer, wherein the circuit layer is electrically connected with a pin of the embedded device.

In another aspect, an embodiment of the present disclosure further provides a semiconductor, comprising the embedded and packaged heat dissipation structure of any one of above embodiments.

Advantages and beneficial effects of the present disclosure will be given partially in the following description, and part of the advantages and beneficial effects will be apparent from the following description, or may be learned by practice of the present disclosure.

In the present disclosure, the embedded device can be arranged in the microchannel and the heat dissipation plate and the heat dissipation copper column attached to the embedded device in the direction perpendicular to the semi-finished plate, so that the heat dissipation effect for the embedded device can be enhanced, and the embedded and packaged heat dissipation structure can meet heat dissipation requirements for a high-frequency and high-speed product.

DETAILED DESCRIPTION

The embodiments of the present disclosure are described in detail in conjunction with the accompanying drawings as follows to illustrate a principle and a process of a method for manufacturing an embedded and packaged heat dissipation structure, an embedded and packaged heat dissipation structure and a semiconductor.

Figure 1:
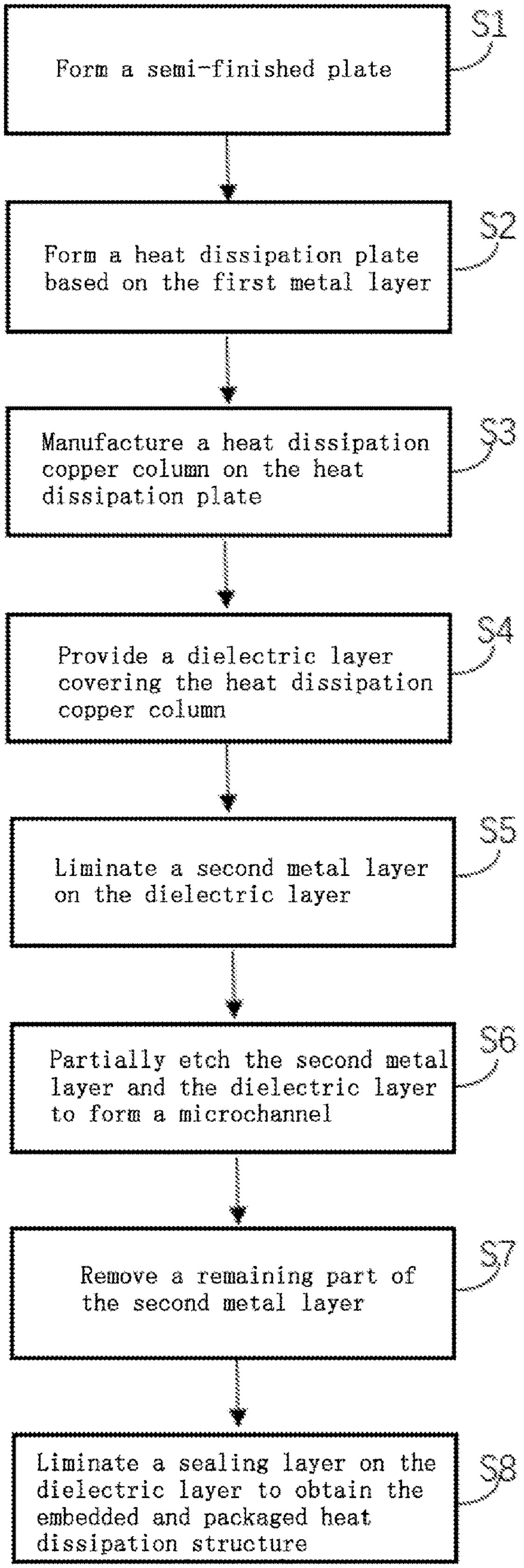
FIG. 1. is a flowchart of a method for manufacturing an embedded and packaged heat dissipation structure according to the present teachings.

Referring to FIG. 1, a method for manufacturing an embedded and packaged heat dissipation structure comprises the following steps.

Step S1: forming a semi-finished plate, wherein the semi-finished plate comprises an embedded device and a first metal layer; and the first metal layer is attached to a non-pin surface of the embedded device.

In this step, the semi-finished plate may comprise an embedded device and a first metal layer, wherein a non-pin surface of the embedded device may be attached to the first metal layer, and the first metal layer attached to the embedded device may be conductive to heat conduction of the embedded device; and the first metal layer may be titanium or other metals with high thermal conductivity and thermal stability. The embedded device may be an active device or a passive device. The semi-finished plate may also comprise a circuit layer, the circuit layer may be electrically connected with the embedded device to realize a function of the embedded device. A dielectric layer may also be arranged between the first metal layer and the circuit layer, and the dielectric layer may fix the embedded device and the first metal layer and may also realize electrical isolation between the first metal layer and the circuit layer.

Step S2: forming a heat dissipation plate based on the first metal layer.

In this step, the first metal layer may be etched into a heat dissipation plate by traditional exposing, developing and etching processes. Because the etching process is adopted in the process of forming the heat dissipation plate, the heat dissipation plate obtained by etching part of the metal layer needs to be attached to the non-pin surface of the embedded device to improve the heat dissipation effect for the embedded device. It should be noted that when a thickness of the first metal layer is relatively small and cannot meet the requirements of the etching process, the metal layer may be thickened by common processes such as electroplating. Alternatively, if the thickness of the heat dissipation plate is too small to meet the heat dissipation performance after the heat dissipation plate is formed, then the heat dissipation plate may also be thickened by electroplating process to meet the specific heat dissipation requirements. Moreover, in some embodiments, if it is necessary to manufacture a circuit layer on the first metal layer, the circuit layer may be made on the basis of the first metal layer while manufacturing the heat dissipation plate by the existing process.

Step S3: manufacturing a heat dissipation copper column on the heat dissipation plate.

In this step, the heat dissipation copper column may be manufactured on the heat dissipation plate, and the heat dissipation copper column may be manufactured by the existing processes, such as applying a photoetching film, forming a pattern by exposing and etching, etc. The heat dissipation copper column may be connected with the heat dissipation plate, and a material of the heat dissipation copper column may be the same as the material of the heat dissipation plate, or the radiating plate may be made of a material with better thermal conductivity.

Step S4: providing a dielectric layer, wherein the dielectric layer covers the heat dissipation copper column.

In this step, the dielectric layer may be provided, the dielectric layer may cover the heat dissipation copper column and adopt a resin film. The resin film may be formed by laminating thermosetting resin and thermoplastic resin or may be made of any one of the thermosetting resin and the thermoplastic resin. The dielectric layer needs to completely cover the heat dissipation copper column. The dielectric layer may provide a support for subsequent processes.

Step S5: laminating a second metal layer on the dielectric layer.

In this step, the second metal layer may comprise a metal material different from the copper. The second metal layer may be used as a protective layer to protect the dielectric layer, thereby avoiding excessive treatment to the dielectric layer in the subsequent processes to cause impact on the subsequent processing.

Step S6: partially etching the second metal layer and the dielectric layer to form a microchannel.

In this step, the second metal layer may be partially etched by existing processes such as exposing, developing, and etching, and the dielectric layer may be partially etched by Plasma to form a microchannel, wherein the heat dissipation copper column and the heat dissipation plate are arranged in the microchannel. Both an outlet and an inlet of the microchannel are arranged on a side surface of the semi-finished plate perpendicular to a direction of the semi-finished plate.

Step S7: removing a remaining part of the second metal layer.

In this step, the remaining part of the second metal layer may be removed by a chemical or physical etching mode, and a reagent not reacting with the heat dissipation plate and the heat dissipation copper column need to be used if using the chemical etching.

Step S8: laminating a sealing layer on the dielectric layer to seal the microchannel in a direction perpendicular to the semi-finished plate to obtain the embedded and packaged heat dissipation structure.

In this step, a sealing layer may be laminated on the dielectric layer by physical laminating, so that the microchannel is sealed in the direction perpendicular to the semi-finished plate to finally obtain the heat dissipation structure. The sealing layer may be used as a base plate for subsequent processing, and the heat generated by the embedded device may be conducted to the outside through the outlet and inlet of the microchannel.

Step S2 for forming a heat dissipation plate based on the first metal layer may comprise:

Step S21: applying a photoetching film to enable the photoetching film to cover the first metal layer.

Step S22: exposing the photoetching film to form a heat dissipation plate pattern.

Step S23: etching the photoetching film and the heat dissipation plate pattern to form the heat dissipation plate.

In the embodiment, the first metal layer may be covered by applying a photoetching film, then the photoetching film is exposed to form the pattern of the heat dissipation plate, and the photoetching film is etched and the first metal layer is partially etched to form the heat dissipation plate, and the heat dissipation plate needs to be completely or partially attached to the embedded device.

Further, Step S6 for partially etching the second metal layer and the dielectric layer to form a microchannel may comprise:

Step S61: forming a window on the second metal layer through a photoetching film applying process, an exposing process and an etching process in sequence, wherein a projection of the window in the direction perpendicular to the semi-finished plate is the same as a projection of the microchannel in the direction perpendicular to the semi-finished plate.

Step S62: etching the dielectric layer to expose the heat dissipation plate and the heat dissipation copper column to form the microchannel.

In this embodiment, the second metal layer may be partially etched by the existing photoetching film applying process, exposing process and etching process to form a window, and then the dielectric layer may be etched by the Plasma process through the window, so that the heat dissipation plate and the heat dissipation copper column are exposed to form the microchannel.

Further, Step S8 for laminating a sealing layer on the dielectric layer to seal the microchannel in a direction perpendicular to the semi-finished plate to obtain the embedded and packaged heat dissipation structure may comprise:

Step S81: applying an adhesive layer on the dielectric layer; and

Step S82: laminating the sealing layer on the adhesive layer to seal the microchannel in the direction perpendicular to the semi-finished plate to obtain the embedded and packaged heat dissipation structure.

In this step, before laminating the sealing layer, it is necessary to first apply the adhesive layer to the dielectric layer, and the microchannel is sealed in the direction perpendicular to the semi-finished plate, that is, the direction perpendicular to the heat dissipation structure through the adhesive layer and the sealing layer, which can meet the requirements of heat dissipation and subsequent processing.

Figure 2:
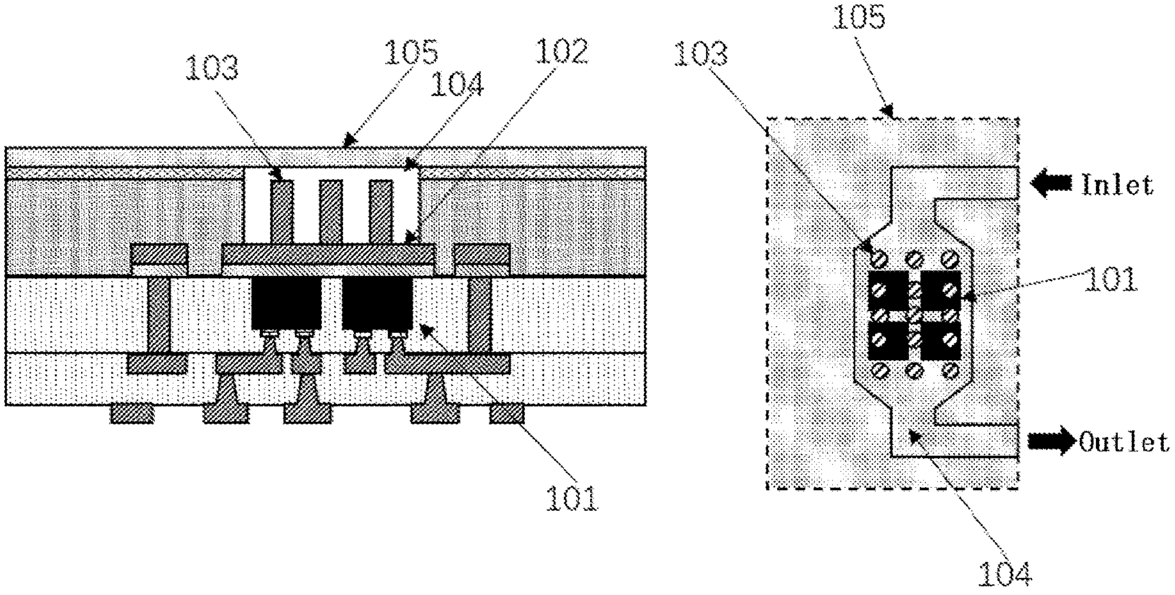
FIG. 2. is a structural schematic diagram of an embedded and packaged heat dissipation structure according to the present teachings.

Moreover, referring to FIG. 2, corresponding to the method of FIG. 1, an example of the present disclosure further provides an embedded and packaged heat dissipation structure obtained by the method for manufacturing an embedded and packaged heat dissipation structure according to any one of teachings, comprising: an embedded device 101, a heat dissipation plate 102, a heat dissipation copper column 103, a microchannel 104 and a sealing layer 105. The heat dissipation plate 102 and the heat dissipation copper column 103 are arranged in the microchannel 104. A non-pin surface of the embedded device 101 is attached to the heat dissipation plate 102. The heat dissipation copper column 103 is connected with the heat dissipation plate 102. The sealing layer 105 is configured for sealing the microchannel 104 in a direction perpendicular to the heat dissipation structure.

Further, in some teachings of the present disclosure, there is provided with one or more embedded devices. Different embedded and packaged heat dissipation structures may have different numbers of embedded devices. The specific number may be adjusted according to the actual requirement.

Further, in some teachings of the present disclosure, there is provided with one or more heat dissipation copper columns. The greater the number of heat dissipation copper columns present, the higher the heat dissipation efficiency. Considering the manufacturing difficulty and the manufacturing cost, the specific number may be adjusted according to the actual requirement.

Further, in some teachings of the present disclosure, the embedded and packaged heat dissipation structure further comprises a circuit layer. The circuit layer is electrically connected with a pin of the embedded device. The circuit layer can provide a basis for the subsequent processing of the embedded and packaged heat dissipation structure and can improve the practicability of the structure.

The contents in the above method teachings are all applicable to the teachings of the embedded and packaged heat dissipation structure, and the functions specifically realized by the teachings of the embedded and packaged heat dissipation structure are the same as the functions of the above method teachings, and the beneficial effects achieved are also the same as the beneficial effects achieved by the above method teachings.

Corresponding to the embedded and packaged heat dissipation structure in FIG. 2, an example of the present disclosure further provides a semiconductor, which may comprise the embedded and packaged heat dissipation structure described in any one of the above teachings.

The method for manufacturing an embedded and packaged heat dissipation structure of the present disclosure is illustrated in conjunction with specific examples as follows.

Example 1

In this example, the number of the embedded devices is 4, the number of the conductive copper columns is 15, the first metal layer is made of a copper material, and the second metal layer is made of a titanium material.

Figure 3:
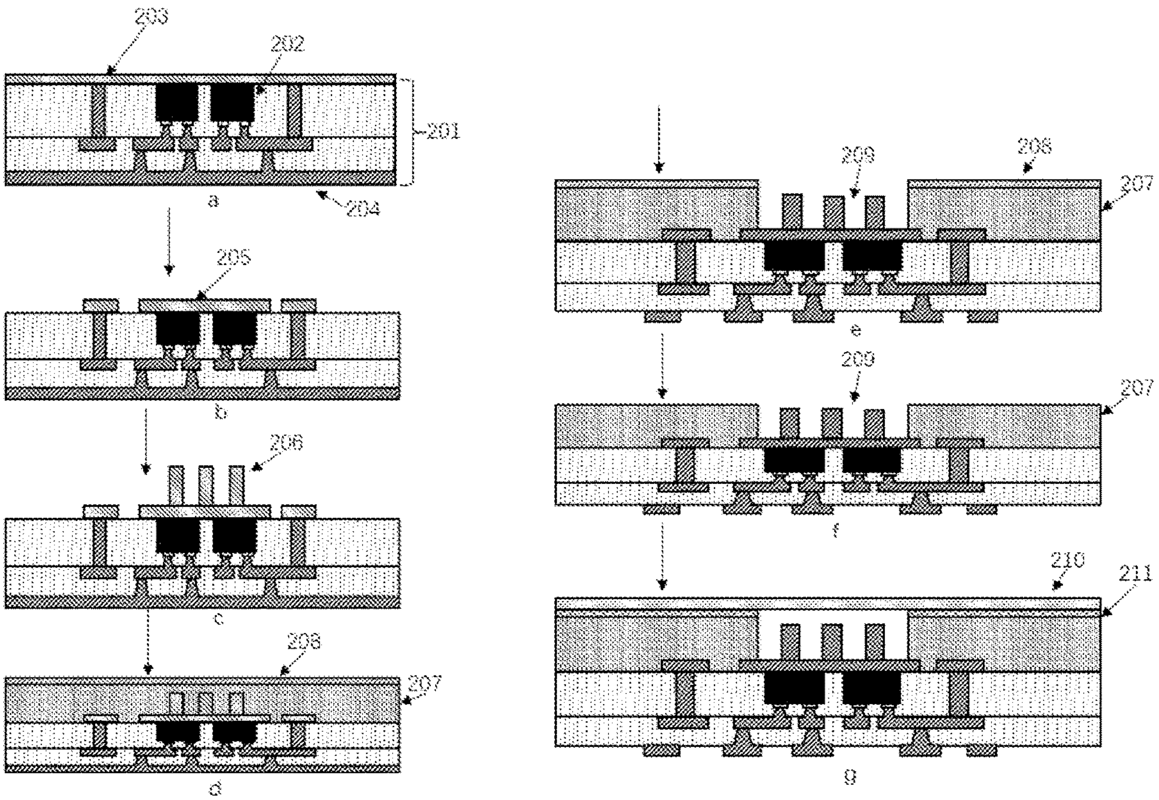
FIG. 3. is a schematic diagram of structural change in a method for manufacturing an embedded and packaged heat dissipation structure according to the present teachings.

Referring to FIG. 3, firstly, a semi-finished plate 201 is manufactured using the existing technology. The semi-finished plate 201 comprises 4 embedded devices 202, a copper layer 203, and a circuit layer 204 connected with the embedded devices 202. The copper layer 203 is attached to a non-pin surface of the embedded devices 202.

A heat dissipation plate 205 is formed through a common manufacturing process based on the copper layer 203. The heat dissipation plate 205 is attached to the non-pin surface of the embedded devices 202.

15 heat dissipation copper columns 206 are manufactured on the heat dissipation plate 205 through a common photo-etching film applying process, an exposing process, a developing process, and an etching process.

A dielectric layer 207 is covered on the heat dissipation plate 205 and the heat dissipation copper columns 206, and a titanium layer 208 is arranged by laminating.

The titanium layer 208 and the dielectric layer 207 are partially etched to form a microchannel 209. The 15 heat dissipation copper columns 206 and the heat dissipation plate 205 are arranged in the microchannel 209. Both an outlet and an inlet of the microchannel 209 are arranged on a side surface of the semi-finished plate 201, perpendicular to the direction of the semi-finished plate 201.

The remaining part of the titanium layer 208 is removed using the existing technology.

Finally, a sealing layer 210 is laminated on the dielectric layer 207. Before laminating the sealing layer, an adhesive layer 211 may be applied. Eventually, the microchannel 209 is sealed in a direction perpendicular to the semi-finished plate. A solder mask 211 is formed on the circuit layer 204 to obtain the final embedded and packaged heat dissipation structure.

Example 2

In this example, the number of the embedded devices is 4, the number of the conductive copper columns is 15, the first metal layer is made of a copper material, and the second metal layer is made of a titanium material.

Figure 4:
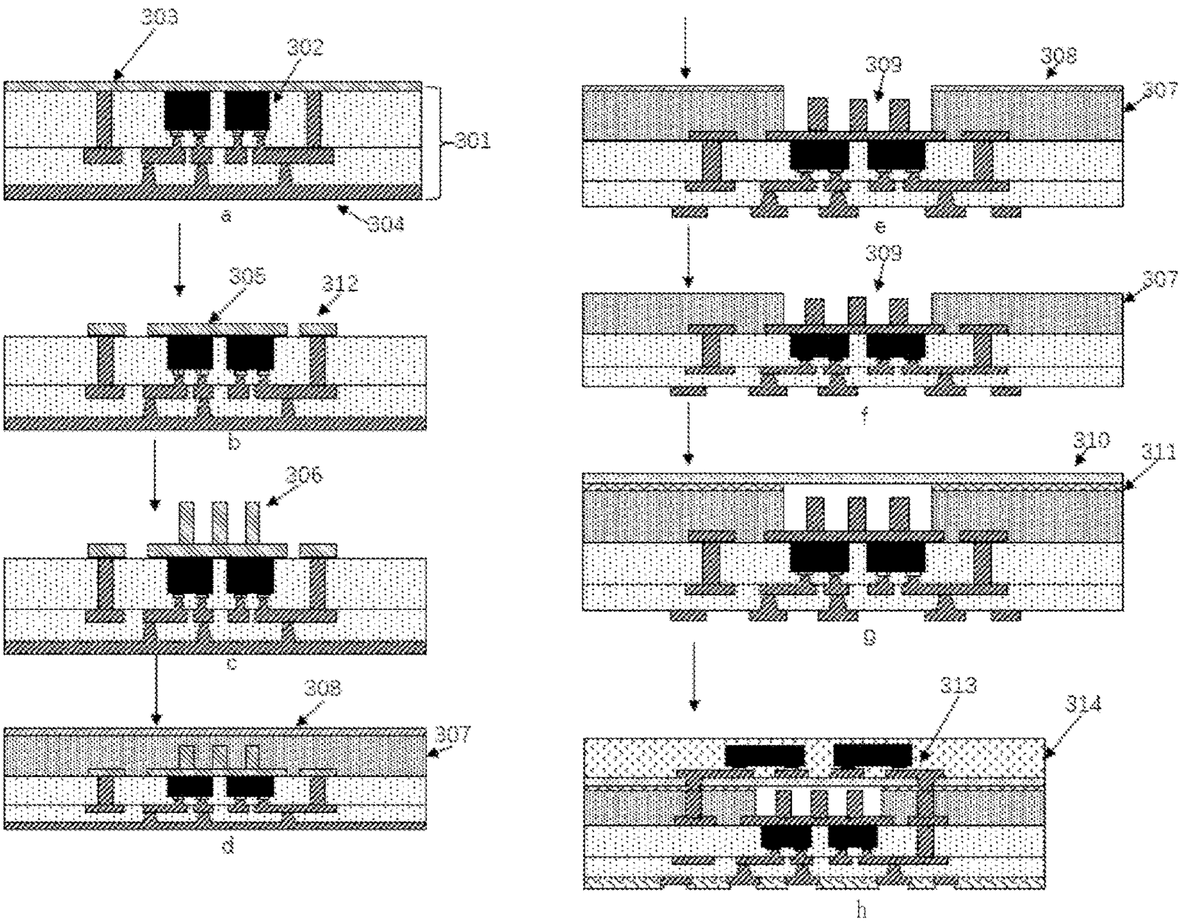
FIG. 4. is a schematic diagram of structural change in another method for manufacturing an embedded and packaged heat dissipation structure according to the present teachings.

Referring to FIG. 4, firstly, a semi-finished plate 301 is manufactured using the existing technology. The semi-finished plate 301 comprises 4 embedded devices 302, a copper layer 303, and a first circuit layer 304 connected with the embedded devices 302. The copper layer 303 is attached to a non-pin surface of the embedded device 302.

A heat dissipation plate 305 and a second circuit layer 312 are formed through a common manufacturing process based on the copper layer 303. The second circuit layer 312 is connected with the first circuit layer 304 and the embedded device 302. The heat dissipation plate 305 is attached to the non-pin surface of the embedded device 302.

15 heat dissipation copper columns 306 are manufactured on the heat dissipation plate 305 through a common photo-etching film applying process, an exposing process, a developing process, and an etching process.

A dielectric layer 307 is covered on the heat dissipation plate 305 and the heat dissipation copper columns 306, and a titanium layer 308 is arranged by laminating.

The titanium layer 308 and the dielectric layer 307 are partially etched to form a microchannel 309. The 15 heat dissipation copper columns 306 and the heat dissipation plate 305 are arranged in the microchannel 309. Both an outlet and an inlet of the microchannel 309 are arranged on a side surface of the semi-finished plate 301, perpendicular to the direction of the semi-finished plate 301.

The remaining part of the titanium layer 308 is removed using the existing technology.

Finally, a sealing layer 310 is laminated on the dielectric layer 307. Before laminating the sealing layer 310, an adhesive layer 311 may be applied. Eventually, the microchannel 309 is sealed in a direction perpendicular to the semi-finished plate. A solder mask 311 is formed on the circuit layer 304. A third circuit layer 313, and a packing layer 314 connected with the embedded device 302, subsequently are manufactured on the sealing layer 310 to obtain the final embedded and packaged heat dissipation structure.

All the contents in the above-mentioned method examples are applicable to the device examples, and the specific functions realized by the device examples are the same as the functions of the above-mentioned method examples, and the beneficial effects achieved are also the same as the beneficial effects achieved by the above-mentioned method examples.

In some optional teachings, the functions/operations mentioned in block diagrams may not occur in accordance with the order mentioned in the operational diagrams. For example, depending on the functions/operations involved, two blocks shown in succession may actually be executed at the same time substantially or the blocks may sometimes be executed in a reverse order. Moreover, the teachings presented and described in the flowcharts of the present disclosure are provided by way of example, with the view of providing a more comprehensive understanding of the technology. The disclosed method is not limited to the operation and logic flow presented herein. Optional variations are expectable in which the order of various operations is changed and in which sub-operations described as part of a larger operation are performed independently.

In the above description, descriptions referring to the terms "an embodiment/implementation", "another embodiment/implementation" or "some embodiments/implementations" mean that specific features, structures, materials or characteristics described in conjunction with the embodiments or examples are contained in at least one embodiment or example of the present disclosure. In the description, the schematic expressions of the above terms do not necessarily refer to the same embodiment or example. Moreover, the specific features, structures, materials or characteristics described may be combined in any one or more embodiments or examples in a suitable manner.

Although the teachings of the present disclosure have been shown and described, those of ordinary skill in the art may understand that many changes, modifications, substitutions and variations may be made to these teachings without departing from the principles and purposes of the present disclosure, and the scope of the present disclosure is defined by the claims and equivalents thereof.

The above are detailed description of examples of the present disclosure, but the present disclosure is not limited to the above examples, and those of ordinary skill in the art may make various equivalent deformations or substitutions without violating the gist of the present disclosure, and the equivalent deformations or substitutions are contained in the scope defined by the claims of the present disclosure.

What is claimed is:

1. A method for manufacturing an embedded and packaged heat dissipation structure, comprising:

a) forming a semi-finished plate, wherein the semi-finished plate comprises an embedded device and a first metal layer, and wherein the first metal layer is attached to a non-pin surface of the embedded device;

b) forming a heat dissipation plate based on the first metal layer, wherein the heat dissipation plate is attached to the non-pin surface of the embedded device;

c) manufacturing a heat dissipation copper column on the heat dissipation plate;

d) providing a dielectric layer, wherein the dielectric layer covers the heat dissipation copper column;

e) laminating a second metal layer on the dielectric layer;

f) partially etching the second metal layer and the dielectric layer to form a microchannel, wherein the heat dissipation copper column and the heat dissipation plate are arranged in the microchannel, and both an outlet and an inlet of the microchannel are arranged on a side surface of the semi-finished plate perpendicular to a direction of the semi-finished plate;

g) removing a remaining part of the second metal layer; and h) laminating a sealing layer on the dielectric layer to seal the microchannel in a direction perpendicular to the semi-finished plate to obtain the embedded and packaged heat dissipation structure.

2. The method according to claim 1, wherein the forming the heat dissipation plate based on the first metal layer comprises:

(i) applying a photoetching film to enable the photoetching film to cover the first metal layer;

(ii) exposing the photoetching film to form a heat dissipation plate pattern; and (iii) etching the photoetching film and the heat dissipation plate pattern to form the heat dissipation plate.

3. The method according to claim 1, wherein the second metal layer is made of titanium or aluminum.

4. The method according to claim 1, wherein the partially etching the second metal layer and the dielectric layer to form a microchannel comprises:

(i) forming a window on the second metal layer through a photoetching film applying process, an exposing process, and an etching process in sequence, wherein a projection of the window in the direction perpendicular to the semi-finished plate is the same as a projection of the microchannel in the direction perpendicular to the semi-finished plate; and (ii) etching the dielectric layer to expose the heat dissipation plate and the heat dissipation copper column to form the microchannel.

5. The method according to claim 1, wherein the laminating the sealing layer on the dielectric layer to seal the microchannel in the direction perpendicular to the semi-finished plate to obtain the embedded and packaged heat dissipation structure comprises:

(i) applying an adhesive layer on the dielectric layer; and (ii) laminating the sealing layer on the adhesive layer to seal the microchannel in the direction perpendicular to the semi-finished plate to obtain the embedded and packaged heat dissipation structure.

* * * * *